United States Patent
Kang et al.

(10) Patent No.: US 9,653,707 B2
(45) Date of Patent: May 16, 2017

(54) ORGANIC LIGHT EMITTING DIODE DISPLAY

(71) Applicant: Samsung Display Co., Ltd., Yongin, Gyeonggi-Do (KR)

(72) Inventors: Nam Su Kang, Seoul (KR); Ji-Hye Shim, Yongin-si (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 0 days.

(21) Appl. No.: 14/728,767

(22) Filed: Jun. 2, 2015

(65) Prior Publication Data
US 2016/0104868 A1 Apr. 14, 2016

(30) Foreign Application Priority Data

Oct. 8, 2014 (KR) ........................ 10-2014-0136203

(51) Int. Cl.
*H01L 29/08* (2006.01)
*H01L 51/52* (2006.01)
*H01L 27/32* (2006.01)

(52) U.S. Cl.
CPC ...... *H01L 51/5275* (2013.01); *H01L 51/5265* (2013.01); *H01L 27/3211* (2013.01); *H01L 51/5218* (2013.01); *H01L 51/5234* (2013.01); *H01L 2251/558* (2013.01)

(58) Field of Classification Search
CPC ............. H01L 27/3265; H01L 27/3258; H01L 27/326; H01L 27/3276; H01L 27/3246; H01L 27/3262; H01L 51/5206
USPC .................................................. 257/40
See application file for complete search history.

(56) References Cited

U.S. PATENT DOCUMENTS 7,973,319 B2 * 7/2011 Kashiwabara ...... H01L 27/3211
257/40
8,525,154 B2 * 9/2013 Kim .................... H01L 51/5265
257/40

FOREIGN PATENT DOCUMENTS

| JP | 2011-204618 A | 10/2011 |
|---|---|---|
| KR | 10-2001-0091666 A | 10/2001 |
| KR | 10-2005-0095099 A | 9/2005 |
| KR | 10-2006-0042728 A | 5/2006 |
| KR | 10-2007-0084940 A | 8/2007 |
| KR | 10-2008-0073256 A | 8/2008 |
| KR | 10-2009-0039065 A | 4/2009 |
| KR | 10-2010-0030866 A | 3/2010 |
| KR | 10-2010-0036331 A | 4/2010 |
| KR | 10-1268534 B1 | 5/2013 |

* cited by examiner

Primary Examiner — Yuanda Zhang
Assistant Examiner — Vu A Vu
(74) Attorney, Agent, or Firm — Ladas & Parry LLP

(57) ABSTRACT

An organic light emitting diode display includes: a first electrode positioned over the substrate; an organic emission layer positioned over the first electrode; a second electrode positioned over the organic emission layer; a refractive layer positioned over the second electrode; and a light transflective metal layer positioned over the refractive layer.

27 Claims, 7 Drawing Sheets

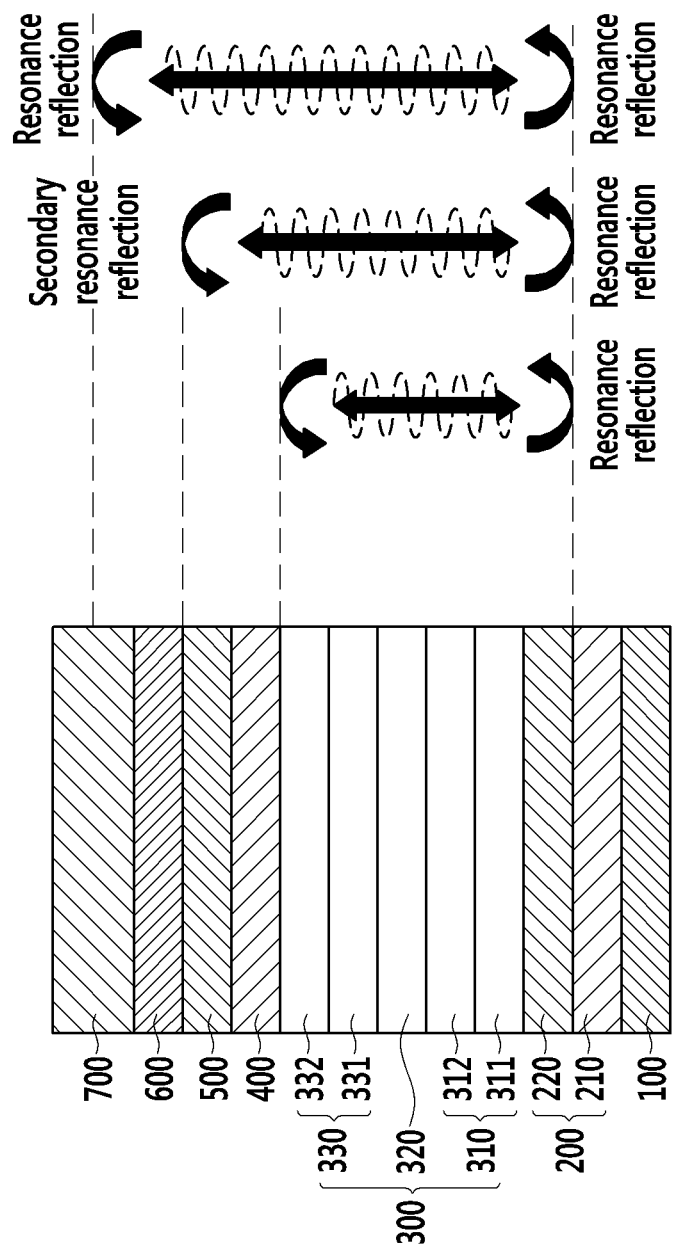

FIG. 4

|  | Ref | MM 1 | MM 2 | MM 3 |
|---|---|---|---|---|
| Blue_y | 0.054 | 0.048 | 0.042 | 0.044 |
| Increasing ratio(%) | 100 | 108 | 116 | 115 |
| Green_x | 0.251 | 0.242 | 0.217 | 0.201 |
| Increasing ratio(%) | 100 | 102 | 114 | 113 |
| Red_x | 0.662 | 0.681 | 0.673 | 0.674 |
| Increasing ratio(%) | 100 | 109 | 114 | 116 |

ORGANIC LIGHT EMITTING DIODE DISPLAY

CROSS-REFERENCE TO RELATED APPLICATION

This application claims priority to and the benefit of Korean Patent Application No. 10-2014-0136203 filed in the Korean Intellectual Property Office on Oct. 8, 2014, the entire contents of which are incorporated herein by reference.

BACKGROUND (a) Field

The present disclosure relates to an organic light emitting diode display. More particularly, the present disclosure relates to an organic light emitting diode display with improved efficiency of light emitted from an organic emission layer by using constructive interference.

(b) Description of the Related Art

A display device displays an image on its display surface. Recently, an organic light emitting diode display has been drawing attention.

The organic light emitting diode display has a self-luminous characteristic, and because the organic light emitting diode display does not need a separate light source, unlike a liquid crystal display, it can have a relatively small thickness and weight. In addition, the organic light emitting diode display exhibits high-quality characteristics such as low power consumption, high luminance, high response speed, etc.

A typical organic light emitting diode display includes an organic light emitting element (an organic light emitting diode) including a first electrode, an organic emission layer, and a second electrode that are sequentially deposited.

Recently, by controlling or adjusting the distance between the first electrode and the second electrode to correspond to a wavelength of light emitted from the organic emission layer, the organic light emitting diode display with improved efficiency of the light emitted from the organic emission layer by using the constructive interference has been developed.

The above information disclosed in this Background section is only for enhancement of understanding and therefore it may contain information that does not form the prior art that is already known in this country to a person of ordinary skill in the art.

SUMMARY

An embodiment of the present invention provides an organic light emitting diode display with improved efficiency of light emitted from the organic emission layer by using constructive interference without considering the wavelength of the light emitted from the organic emission layer.

One aspect of the present invention provides an organic light emitting diode display including: a first electrode positioned on a substrate; an organic emission layer positioned on the first electrode; a second electrode positioned on the organic emission layer; a refractive layer positioned on the second electrode; and a light transflective metal layer positioned on the refractive layer.

A distance from the first electrode to the light transflective metal layer may be satisfied by an equation as follows.

$$L < \lambda/N$$

Here, L is a distance from the first electrode to the light transflective metal layer, $\lambda$ is a wavelength of light emitted from the organic emission layer, and N is an even number.

N may be one of 2, 4, 8, and 16.

The refractive layer may respectively contact the second electrode and the light transflective metal layer between the second electrode and the light transflective metal layer.

The first electrode, the organic emission layer, and the second electrode may respectively contact each other.

The organic emission layer may include: a first organic layer contacting the first electrode; a second organic layer contacting the second electrode; and a main emission layer respectively contacting the first organic layer and the second organic layer between the first organic layer and the second organic layer.

The main emission layer may include: a first sub-emission layer emitting light of a first color; a second sub-emission layer separated from the first sub-emission layer on a plane and emitting light of a second color; and a third sub-emission layer separated from the second sub-emission layer on a plane and emitting light of a third color.

A distance from the first electrode respectively positioned with the first sub-emission layer, the second sub-emission layer, and the third sub-emission layer to the light transflective metal layer may be the same.

The first electrode may be a light reflective electrode, and the second electrode may be a light transflective electrode.

The second electrode and the light transflective metal layer may respectively have a thickness of 5 nm to 15 nm.

The refractive layer may have the thickness of less than that of the second electrode.

The refractive layer may have a thickness of less than that of the light transflective metal layer.

The thickness of the refractive layer may be 5 nm to 15 nm.

The second electrode and the light transflective metal layer may be formed of the same material.

The second electrode and the light transflective metal layer may respectively include silver (Ag).

The refractive layer may include an organic material or an inorganic material.

A refractive index of the refractive layer may be 1.1 to 1.8.

The refractive index of the refractive layer may be 1.8 to 2.2.

A capping layer positioned on the light transflective metal layer may be further included.

The capping layer may have a thickness of 50 nm to 110 nm.

Another aspect of the invention provides an organic light emitting diode display comprising: a substrate; a first electrode positioned over the substrate; an organic emission layer positioned over the first electrode; a second electrode positioned over the organic emission layer; a refractive layer positioned over the second electrode; and a light transflective metal layer positioned over the refractive layer.

In the foregoing display, a distance from the first electrode to the light transflective metal layer may be satisfied by an equation as follows: $L < \lambda/N$ where L is a distance from the first electrode to the light transflective metal layer, $\lambda$ is a wavelength of light emitted from the organic emission layer, and N is an even number. N may be one of 2, 4, 8, and 16. The refractive layer may be located between the second electrode and the light transflective metal layer and may contact both the second electrode and the light transflective metal layer. The first electrode may contact the organic emission layer which contacts the second electrode. The organic emission layer may comprise: a first organic layer contacting the first electrode; a second organic layer contacting the second electrode; and a main light emission layer located between the first organic layer and the second organic layer and contacting both the first organic layer and the second organic layer. The main light emission layer may comprise: a first emission layer portion configured to emit light of a first color; a second emission layer portion separated from the first emission layer portion when viewed in a viewing direction perpendicular to a major surface of the substrate and configured to emit light of a second color; and a third emission layer portion separated from the first emission layer portion and the second emission layer portion when viewed in the viewing direction and configured to emit light of a third color. A distance from the first electrode to the light transflective metal layer through the first emission layer portion, a distance from the first electrode to the light transflective metal layer through the second emission layer portion, and a distance from the first electrode to the light transflective metal layer through the third emission layer portion may be substantially the same.

Still in the foregoing display, the first electrode may be a light reflective electrode; and the second electrode is a light transflective electrode. Each of the second electrode and the light transflective metal layer may have a thickness of about 5 nm to about 15 nm. The refractive layer may have a thickness of less than that of the second electrode. The refractive layer may have a thickness of less than that of the light transflective metal layer. The thickness of the refractive layer may be about 5 nm to about 15 nm. The second electrode and the light transflective metal layer may be formed of the same material. The second electrode and the light transflective metal layer respectively may comprise silver (Ag). The refractive layer may comprise an organic material. A refractive index of the refractive layer may be about 1.1 to about 1.8. The refractive index of the refractive layer may be about 1.8 to about 2.2. The display may further comprise a capping layer positioned over the light transflective metal layer. The capping layer may have a thickness of about 50 nm to about 110 nm.

According to an embodiment of the present invention, without considering the wavelength of the light emitted from the organic emission layer, the organic light emitting diode display with improved efficiency of light emitted from the organic emission layer by using constructive interference is provided.

BRIEF DESCRIPTION OF THE DRAWINGS

FIG. 2 is a view to explain an effect of an organic light emitting diode display according to an embodiment of the present invention.

FIG. 4 is a table to explain an effect of an organic light emitting diode display according to an embodiment of the present invention.

DETAILED DESCRIPTION

Figure 1:
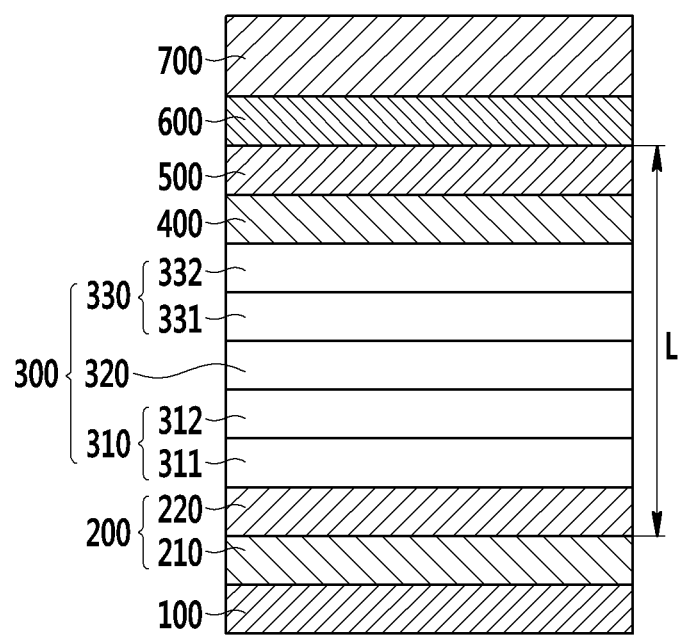
FIG. 1 is a schematic cross-sectional view of an organic light emitting diode display according to an embodiment of the present invention.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in embodiments, since like reference numerals designate like elements having the same configuration, a first embodiment is representatively described, and in other embodiments, only configurations different from the first embodiment will be described.

In addition, the size and thickness of each element shown in the drawings are arbitrarily shown for better understanding and ease of description, but the present invention is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "~on" means positioning above or below the object portion, but does not essentially mean positioning on the upper side of the object portion based on a gravity direction.

Now, an organic light emitting diode display according to an embodiment of the present invention will be described with reference to FIG. 1 to FIG. 4.

FIG. 1 is a schematic cross-sectional view of an organic light emitting diode display according to an embodiment of the present invention.

In embodiments, an organic light emitting diode display includes a substrate, an array of pixels disposed over the substrate, a plurality of switching circuits disposed over the substrate. Each of the switching circuits controls the operation of one of the pixels and includes at least one thin film transistor.

As shown in FIG. 1, an organic light emitting diode display according to an embodiment of the present invention includes a substrate 100, a first electrode 200 positioned on the substrate 100, an organic emission layer 300 positioned on the first electrode 200, a second electrode 400 positioned on the organic emission layer 300, a refractive layer 500 positioned on the second electrode 400, a light transflective metal layer 600 positioned on the refractive layer 500, and a capping layer 700 positioned on the light transflective metal layer 600. In embodiments, the first electrode 200, the organic emission layer 300 and the second electrode 400 forms one of the pixels in the pixel array.

The substrate 100 is an insulating substrate including glass, a polymer, or stainless steel. The substrate 100 may be flexible, stretchable, foldable, bendable, or rollable. When the substrate 100 is flexible, stretchable, foldable, bendable, or rollable, the entire light emitting diode display may be flexible, stretchable, foldable, bendable, or rollable.

At least one scan wire, at least one data wire, a plurality of thin film transistors, and at least one capacitor may be formed on the substrate 100, and these elements may have various disclosed structures.

The first electrode 200 is positioned on the substrate 100. The first electrode 200 may be connected to any one drain electrode among the plurality of thin film transistors through a contact hole formed in the insulating layer. The first electrode 200 is an anode as a hole injection electrode and a light reflective electrode. The first electrode 200 includes a light reflecting electrode layer 210 and a hole injection electrode layer 220.

The light reflecting electrode layer 210 may include a single layer or a plurality of layers including at least one of magnesium-silver (MgAg), silver-magnesium (AgMg), aluminum (Al), and silver (Ag).

The hole injection electrode layer 220 may include a single transmission conductive layer or a plurality of light transmission conductive layers including at least one of indium tin oxide (ITO) and indium zinc oxide (IZO). The hole injection electrode layer 220 may include a conductive material having a higher work function than the light reflecting electrode layer 210 to increase a hole injection capacity for the organic emission layer 300.

The organic light emission layer 300 is positioned on the first electrode 200 corresponding to the emission region EA of the first electrode 200. The organic emission layer 300 may be made of a low-molecular organic material or a high-molecular organic material such as poly(3,4-ethylenedioxythiophene) (PEDOT).

The organic emission layer 300 includes a first organic layer 310 positioned on the first electrode 200, a main emission layer 320 positioned on the first organic layer 310, and a second organic layer 330 positioned on the main emission layer 320.

The first organic layer 310 may be formed of a multilayered structure in which a first organic sub-layer 311 and a second organic sub-layer 312 including at least one of a hole injection layer (HIL) and a hole transporting layer (HTL) are deposited.

The main emission layer 320 respectively contacts the first organic layer 310 and the second organic layer 330 between the first organic layer 310 and the second organic layer 330.

The main emission layer 320 may include a red organic emission layer emitting red light, a green organic emission layer emitting green light, and a blue organic emission layer emitting blue light, and the red organic emission layer, the green organic emission layer, and the blue organic emission layer are respectively formed in a red pixel, a green pixel, and a blue pixel, thereby realizing a color image. The main emission layer 320 may implement the color image by integrally laminating all of the red organic emission layer, the green organic emission layer, and the blue organic emission layer in the red pixel, the green pixel, and the blue pixel and by respectively forming a red color filter, a green color filter, and a blue color filter in each pixel.

As another example, a white organic emission layer emitting white light as the main emission layer 320 is formed, and a red color filter, a green color filter, and a blue color filter are respectively formed for every pixel to implement a color image. When the color image is implemented by using the white organic emission layer as the main emission layer 320 and the color filter, a plurality of deposition masks for depositing the red organic emission layer, the green organic emission layer, and the blue organic emission layer to form individual color pixels, for example, the red pixel, the green pixel, and the blue pixel, are not required.

The white organic emission layer as the main emission layer 320 described in another embodiment may be formed to have a single organic emission layer, and may further include a configuration in which a plurality of organic emission layers are laminated to emit white light. For example, the main emission layer 320 may include a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light.

The second organic layer 330 may be formed of a multilayered structure in which a third organic sub-layer 331 and a fourth organic sub-layer 332 including at least one of an electron transporting layer (ETL) and an electron injection layer (EI) are deposited.

The second electrode 400 is a cathode of an electron injection electrode and is a light transflective electrode. The second electrode 400 may be a common electrode positioned throughout the entire substrate 100 to cover the organic emission layer 300. The second electrode 400 may include the single conductive layer or the plurality of layers including at least one of magnesium-silver (MgAg), silver-magnesium (AgMg), aluminum (Al), and silver (Ag). In one embodiment, the second electrode 400 may have a thickness of about 5 nm to about 15 nm to realize the light transflection, but not limited thereto. In another embodiment, the second electrode 400 may have a thickness of about 3 nm to about 25 nm. When the second electrode 400 is too thin, an island shape or an undesired hole may be formed in the second electrode. When the second electrode 400 is too thick, the light emitted from the organic emission layer may be blocked by the second electrode such that the luminance of the light emitted from the organic emission layer 300 may be deteriorated.

The described first electrode 200, organic emission layer 300, and second electrode 400 respectively contact each other.

As described above, in the organic light emitting diode display according to an embodiment of the present invention, the light emitted from the organic emission layer 300 is reflected by the first electrode 200 as the light reflective electrode and transmits through the second electrode 400 as the light transflective electrode, thereby emitting the light in the direction of the capping layer 700. That is, the organic light emitting diode display according to an embodiment of the present invention is a front emissive type of organic light emitting diode display. On the other hand, in the organic light emitting diode display according to another embodiment of the present invention, the first electrode is formed of the light transflective electrode and the second electrode is formed of the light reflective electrode, thereby forming a bottom emissive type of organic light emitting diode display in which the light emitted from the organic emission layer is emitted in the substrate direction. In this case, the refractive layer, the light transflective metal layer, and the capping layer may be respectively positioned between the first electrode and the substrate.

The refractive layer 500 respectively contacts the second electrode 400 and the light transflective metal layer 600 between the second electrode 400 and the light transflective metal layer 600.

The refractive layer 500 has a thickness that is less than those of the second electrode 400 and the light transflective metal layer 600. The refractive layer 500 may have a thickness of about 5 nm to about 15 nm. In another embodiment, the refractive layer 500 may have a thickness of about 3 nm to about 25 nm. When the refractive layer 500 is too thin, an island shape or an undesired hole may be formed in the refractive layer 500. When the refractive layer 500 is too thick, the distance from the first electrode 200 to the light transflective metal layer 600 is undesirably set as the distance corresponding to the wavelength of the light of red, green, or blue that does not correspond to the light emitted from the organic emission layer 300 due to the thickness of the refractive layer 500 such that destructive interference may be generated in the light emitted from the organic emission layer 300, thereby the color reproducibility or the luminance of the light emitted from the organic emission layer 300 is deteriorated, and as a result, the efficiency of the light emitted from the organic emission layer 300 may be deteriorated.

The refractive layer 500 may include the organic material or the inorganic material. A refractive index of the refractive layer 500 may vary depending on its material. In one embodiment, a refractive index of the refractive layer 500 may be about 1.1 to about 1.8. In another embodiment, a refractive index of the refractive layer 500 may be about 1.8 to about 2.2. When the refractive index of the refractive layer 500 is too high, the light emitted from the organic emission layer 300 and transmitted through the refractive layer 500 is refracted by the refractive layer 500 and is irradiated in an undesired direction such that the light emitted from the organic emission layer 300 is recognized in the undesired direction and the display of the entire organic light emitting diode display may be deteriorated.

The light transflective metal layer 600 may include a single layer or a multilayered structure including at least one of magnesium-silver (MgAg), silver-magnesium (AgMg), aluminum (Al), and silver (Ag). The light transflective metal layer 600 may be formed of the same material as the second electrode 400. The light transflective metal layer 600 respectively contacts the refractive layer 500 and the capping layer 700. The light transflective metal layer 600 may have a thickness of about 5 nm to about 15 nm to realize the light transflection. In another embodiment, the light transflective metal layer 600 may have a thickness of about 3 nm to about 25 nm. When the light transflective metal layer 600 is too thin, an island shape or an undesired hole may be formed in the light transflective metal layer 600. When the light transflective metal layer 600 is too thick, the light emitted from the organic emission layer 300 is blocked by the light transflective metal layer 600 such that the luminance of the light emitted from the organic emission layer 300 may be deteriorated.

The distance from the light transflective metal layer 600 to the first electrode 200 is satisfied by the following equation.

$$L < \lambda/N$$

Here, L is the distance from the first electrode 200 to the light transflective metal layer 600, $\lambda$ is the wavelength of the light emitted from the organic emission layer 300, and N is an even number. For example, N may be any one of 2, 4, 8, and 16.

That is, the distance from the first electrode 200 to the light transflective metal layer 600 is not the distance corresponding to the wavelength of the light emitted from the organic emission layer 300 and simultaneously is shorter than the distance corresponding to the wavelength of the light emitted from the organic emission layer 300.

In summary, the distance between the light transflective metal layer 600 and the first electrode 200 is not set by corresponding to $\lambda$ of the wavelength of the light emitted from the organic emission layer 300, but the distance L between the light transflective metal layer 600 and the first electrode 200 is set as the distance that is shorter than the distance corresponding to $\lambda$ of the wavelength of the light emitted from the organic emission layer 300.

The capping layer 700 is positioned on the light transflective metal layer 600 to contact the light transflective metal layer 600, and has a thickness of about 50 nm to about 110 nm. The capping layer 700 may be formed by depositing a plurality of layers having various refractive indexes, and elements having different refractive indexes may be positioned therein.

In embodiments, the light transflective metal layer 600 reflects light more than the immediately neighboring layers, such as, the refractive layer 500 and a sub-layer of the capping layer 700. On the other hand, the light transflective metal layer 600 transmits less light than the immediately neighboring layers. However, the present invention is not limited thereto.

Next, an effect of an organic light emitting diode display according to an embodiment of the present invention will be described with reference to FIG. 2 to FIG. 4.

FIG. 2 is a view to explain an effect of an organic light emitting diode display according to an embodiment of the present invention.

As shown in FIG. 2, the light emitted from the organic emission layer 300 of the organic light emitting diode display according to an embodiment of the present invention undergoes the resonance and reflection by the constructive interference between the first electrode 200 as the light reflective electrode and the second electrode 400 as the light transflective electrode, then secondarily undergoes the strong resonance and reflection by the constructive interference between the first electrode 200 and the light transflective metal layer 600, and further undergoes the resonance and the reflection by the constructive interference between the first electrode 200 and the capping layer 700, such that the light intensity of the light emitted from the organic emission layer 300 and a color reproducibility range are improved.

Figure 3A:
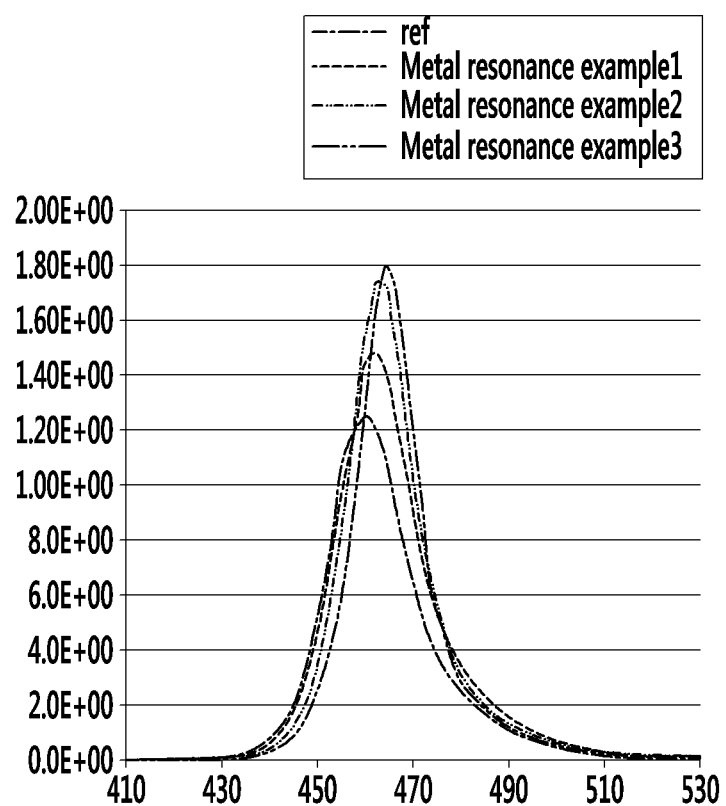
FIGS. 3A, 3B, and 3C are graphs to explain an effect of an organic light emitting diode display according to an embodiment of the present invention.
Figure 3B:
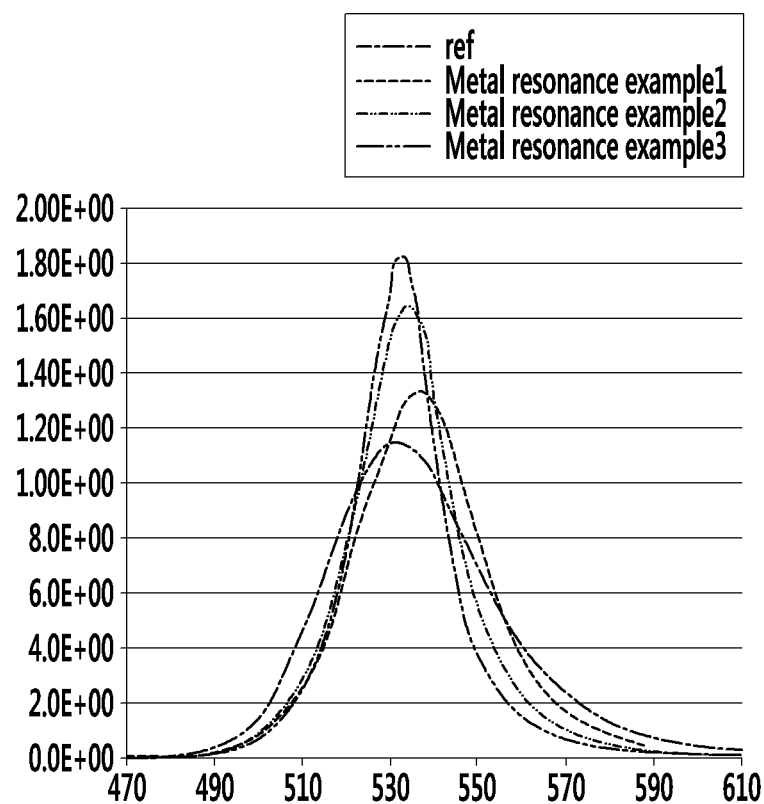
Figure 3C:
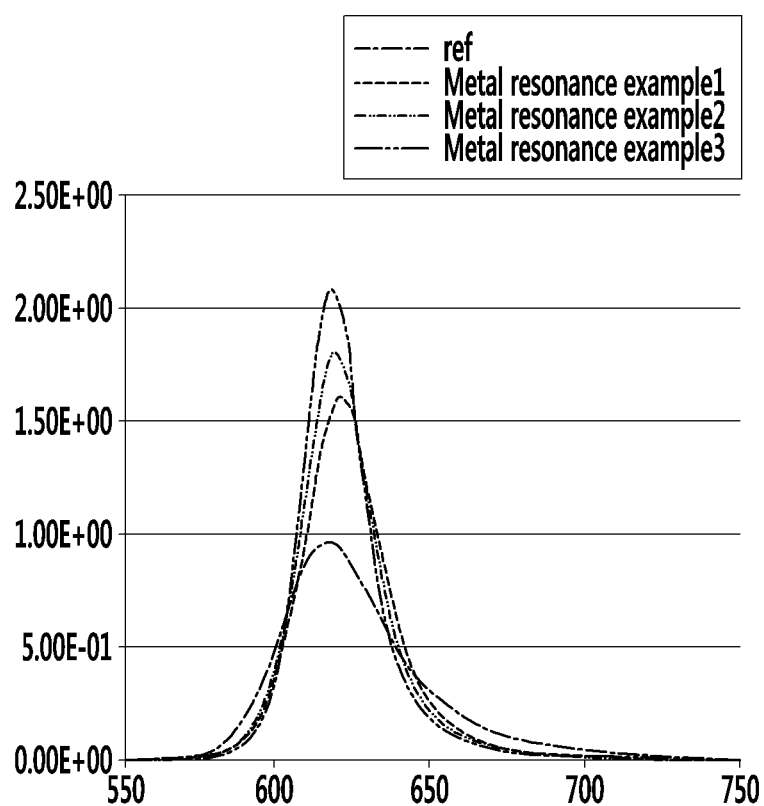

An experiment to confirm the intensity improvement of the light emitted from the organic emission layer 300 is performed, and the results are shown in FIGS. 3A, 3B and 3C.

FIGS. 3A, 3B, and 3C are graphs to explain an effect of an organic light emitting diode display according to an embodiment of the present invention. In FIGS. 3A, 3B and 3C, Ref represents a conventional organic light emitting diode display without the refractive layer 500 and the light transflective metal layer 600, Metal Resonance Example 1 represents an experimental example having the refractive layer 500 of the thickness of 5 nm, Metal Resonance Example 2 represents an experimental example having the refractive layer 500 of the thickness of 10 nm, and Metal Resonance Example 3 is an experimental example having the refractive layer 500 of the thickness of 15 nm. FIG. 3A is a graph showing the intensity of the light of the organic emission layer emitting the blue light, and FIG. 3B is a graph showing the intensity of the light of the organic emission layer emitting the green light, and FIG. 3C is a graph showing the intensity of the light of the organic emission layer emitting the red light.

As shown in FIGS. 3A, 3B, and 3C, compared with a typical organic light emitting diode display of Ref, it is confirmed that the intensity of the light is improved in the Metal Resonance Examples 1, 2, and 3 of the organic light emitting diode display according to an embodiment of the present invention.

An experiment to confirm the color reproducibility improvement of the light emitted from the organic emission layer 300 is performed, and the results are shown in FIG. 4.

FIG. 4 is a table to explain an effect of an organic light emitting diode display according to an embodiment of the present invention. FIG. 4 is a table showing color coordinates according to a CIE chromaticity diagram. In FIG. 4, Ref represents the conventional organic light emitting diode display without the refractive layer 500 and the light transflective metal layer 600, MIM 1 represents an experimental example having the refractive layer 500 of the thickness of 5 nm, MIM 2 represents an experimental example having the refractive layer 500 of the thickness of 10 nm, and MIM 3 represents an experimental example having the refractive layer 500 of the thickness of 15 nm.

As shown in FIG. 4, compared with a typical organic light emitting diode display of Ref, it is confirmed that each color reproducibility of blue (Blue_y), green (Green_x), and red (Red_x) is improved in the MIM 1, 2, and 3 of the organic light emitting diode display according to an embodiment of the present invention.

As described above, the organic light emitting diode display according to an embodiment of the present invention includes the refractive layer 500 and the light transflective metal layer 600 positioned on the second electrode 400. Thus, the light intensity from the organic emission layer 300 and the color reproducibility are improved. Further, the efficiency of the light emitted from the organic emission layer 300 is improved, thereby providing the organic light emitting diode display with improved image display quality.

Also, in the organic light emitting diode display according to an embodiment of the present invention, it is possible to simply deposit the refractive layer 500 and the light transflective metal layer 600 as a thin film on the second electrode 400 without considering the wavelength of the light emitted from the organic emission layer 300. Thus, since the manufacturing process of the organic light emitting diode display is simplified, the manufacturing time and the manufacturing cost are reduced compared with the conventional organic light emitting diode displays which require efforts for deliberately adjusting or controlling the distance generating the resonance corresponding to the wavelength of the light emitted from the organic emission layer 300.

Also, in the organic light emitting diode display according to an embodiment of the present invention, it is possible to simply deposit each of the refractive layer 500 and the light transflective metal layer 600 as a thin film on the second electrode 400 without considering the wavelength of the light emitted from the organic emission layer 300. Thus, an additional configuration or layer for adjusting or controlling the distance which can generate the resonance corresponding to the wavelength of the light emitted from the organic emission layer 300 is not necessary. Such additional configuration or layer may decrease the luminance of the light emitted from the organic emission layer 300. Thus, as compared with the organic light emitting diode display using the conventional resonance structure, the organic light emitting diode display with improved luminance can be provided in devices according to embodiments of the invention.

Next, the organic light emitting diode display according to another embodiment of the present invention will be described with reference to FIG. 5.

Hereinafter, differences from the above described organic light emitting diode display according to an embodiment of the present invention will be described.

Figure 5:
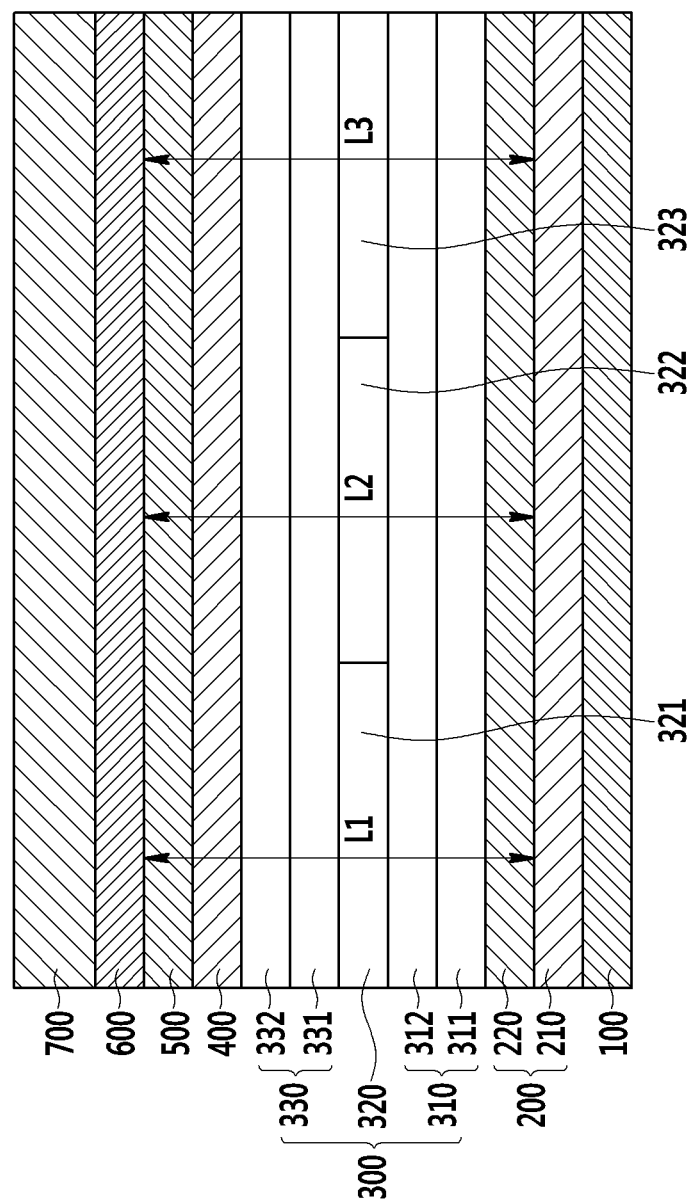
FIG. 5 is a schematic cross-sectional view of an organic light emitting diode display according to another embodiment of the present invention.

FIG. 5 is a schematic cross-sectional view of an organic light emitting diode display according to another embodiment of the present invention.

As shown in FIG. 5, the organic light emitting diode display according to another embodiment of the present invention includes the substrate 100, the first electrode 200 positioned on the substrate 100, the organic emission layer 300 positioned on the first electrode 200, the second electrode 400 positioned on the organic emission layer 300, the refractive layer 500 positioned on the second electrode 400, the light transflective metal layer 600 positioned on the refractive layer 500, and the capping layer 700 positioned on the light transflective metal layer 600.

The main emission layer 320 includes a first emission layer portion 321 emitting light of a first color, a second emission layer portion 322 separated from the first emission layer portion 321 on a plane and emitting light of a second color, and a third emission layer portion 323 separated from the second emission layer portion 322 on plane and emitting light of a third color. Here, each of the first color, the second color, and the third color may be one color among red, blue, green, and white. The first color, the second color, and the third color may be the same as each other, or may be different from each other.

A first distance L1 from the first electrode 200 to the light transflective metal layer 600 through the first emission layer portion 321, a second distance L2 from the first electrode 200 to the light transflective metal layer 600 through the second emission layer portion 322, and a third distance L3 from the first electrode 200 to the light transflective metal layer 600 through the third emission layer portion 323 are substantially the same.

As described above, the organic light emitting diode display according to another embodiment of the present invention includes the refractive layer 500 and the light transflective metal layer 600 positioned over the first emission layer portion 321, the second emission layer portion 322, and the third emission layer portion 323, thereby improving the intensity and the color reproducibility of the light emitted from the first emission layer portion 321, the second emission layer portion 322, and the third emission layer portion 323. Thus, the efficiency of the light emitted from the organic emission layer 300 is improved such that the organic light emitting diode display with improved image display quality is provided.

Also, in the organic light emitting diode display according to another embodiment of the present invention, by simply depositing the refractive layer 500 and the light transflective metal layer 600 as the thin film on the second electrode 400 without considering the wavelength of the light respectively emitted from the first emission layer portion 321, the second emission layer portion 322, and the third emission layer portion 323, since the manufacturing process of the organic light emitting diode display is simplified, the manufacturing time and the manufacturing cost are reduced compared with the conventional organic light emitting diode display controlling the distance generating the resonance corresponding to the wavelength of the light emitted from the first emission layer portion 321, the second emission layer portion 322, and the third emission layer portion 323 by considering the wavelength of the first emission layer portion 321, the second emission layer portion 322, and the third emission layer portion 323.

Further, in the organic light emitting diode display according to another embodiment of the present invention, by simply depositing the refractive layer 500 and the light transflective metal layer 600 as the thin film on the second electrode 400 without considering the wavelength of the light emitted from the first emission layer portion 321, the second emission layer portion 322, and the third emission layer portion 323, an additional configuration to control the distance generating the resonance corresponding to the wavelength of the light emitted from the first emission layer portion 321, the second emission layer portion 322, and the third emission layer portion 323 by considering the wavelength of the first emission layer portion 321, the second emission layer portion 322, and the third emission layer portion 323 is not necessary, the luminance is suppressed from being deteriorated by the additional configuration for the light emitted from the first emission layer portion 321, the second emission layer portion 322, and the third emission layer portion 323. That is, compared with the organic light emitting diode display using the conventional resonance, the organic light emitting diode display with improved luminance is provided.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
a substrate;
a first electrode positioned over the substrate;
an organic emission layer positioned over the first electrode;
a second electrode positioned over the organic emission layer;
a refractive layer positioned over the second electrode; and
a light transflective metal layer positioned over the refractive layer,
wherein light emitted from the organic emission layer undergoes resonance and reflection the constructive interference between the first electrode and the light transflective metal layer and a distance from the first electrode to the light transflective metal layer is satisfied by an equation as follows:

$$L < \lambda / N$$

where L is a resonant distance from the first electrode to the light transflective metal layer, $\lambda$ is a wavelength of light emitted from the organic emission layer, and N is an even number.

2. The organic light emitting diode display of claim 1, wherein N is one of 2, 4, 8, and 16.

3. The organic light emitting diode display of claim 1, wherein N is one of 4, 8, and 16.

4. An organic light emitting diode display comprising:
a substrate;
a first electrode positioned over the substrate;
an organic emission layer positioned over the first electrode;
a second electrode positioned over the organic emission layer;
a refractive layer positioned over the second electrode; and
a light transflective metal layer positioned over the refractive layer,
wherein the refractive layer is located between the second electrode and the light transflective metal layer and contacts both the second electrode and the light transflective metal layer,
wherein the first electrode contacts the organic emission layer which contacts the second electrode,
wherein the organic emission layer comprises:
a first organic layer contacting the first electrode;
a second organic layer contacting the second electrode; and
a main light emission layer located between the first organic layer and the second organic layer and contacting both the first organic layer and the second organic layer,
wherein the main light emission layer comprises:
a first emission layer portion configured to emit light of a first color;
a second emission layer portion separated from the first emission layer portion when viewed in a viewing direction perpendicular to a major surface of the substrate and configured to emit light of a second color; and
a third emission layer portion separated from the first emission layer portion and the second emission layer portion when viewed in the viewing direction and configured to emit light of a third color,
wherein a distance from the first electrode to the light transflective metal layer through the first emission layer portion, a distance from the first electrode to the light transflective metal layer through the second emission layer portion, and a distance from the first electrode to the light transflective metal layer through the third emission layer portion are substantially the same.

5. The organic light emitting diode display of claim 4, wherein light emitted from the organic emission layer undergoes resonance and reflection the constructive interference between the first electrode and the light transflective metal layer and a distance from the first electrode to the light transflective metal layer is satisfied by an equation as follows:

$$L < \lambda / N$$

where L is a resonant distance from the first electrode to the light transflective metal layer, $\lambda$ is a wavelength of light emitted from the organic emission layer, and N is an even number.

6. The organic light emitting diode display of claim 5, wherein N is one of 2, 4, 8, and 16.

7. An organic light emitting diode display comprising:
a substrate;
a first electrode positioned over the substrate;
an organic emission layer positioned over the first electrode;
a second electrode positioned over the organic emission layer;
a refractive layer positioned over the second electrode;
a light transflective layer positioned over the refractive layer; and
a capping layer positioned over the light transflective layer, wherein light emitted from the organic emission layer undergoes resonance and reflection by constructive interference between the first electrode and the second electrode, undergoes resonance and reflection by constructive interference between the first electrode and the light transflective layer, and undergoes resonance and reflection by constructive interference between the first electrode and capping layer, wherein a distance from the first electrode to the light transflective layer is satisfied by an equation as follows:

$$L < \lambda/N$$

where L is a resonant distance from the first electrode to the light transflective layer, $\lambda$ is a wavelength of light emitted from the organic emission layer, and N is an even number.

8. The organic light emitting diode display of claim 7, wherein N is one of 2, 4, 8, and 16.

9. The organic light emitting diode display of claim 7, wherein the refractive layer is located between the second electrode and the light transflective layer and contacts both the second electrode and the light transflective layer.

10. The organic light emitting diode display of claim 9, wherein the first electrode contacts the organic emission layer which contacts the second electrode.

11. The organic light emitting diode display of claim 10, wherein the organic emission layer comprises:
a first organic layer contacting the first electrode;
a second organic layer contacting the second electrode; and
a main light emission layer located between the first organic layer and the second organic layer and contacting both the first organic layer and the second organic layer.

12. The organic light emitting diode display of claim 11, wherein the main light emission layer comprises:
a first emission layer portion configured to emit light of a first color;
a second emission layer portion separated from the first emission layer portion when viewed in a viewing direction perpendicular to a major surface of the substrate and configured to emit light of a second color; and
a third emission layer portion separated from the first emission layer portion and the second emission layer portion when viewed in the viewing direction and configured to emit light of a third color.

13. The organic light emitting diode display of claim 12, wherein a distance from the first electrode to the light transflective layer through the first emission layer portion, a distance from the first electrode to the light transflective layer through the second emission layer portion, and a distance from the first electrode to the light transflective layer through the third emission layer portion are substantially the same.

14. The organic light emitting diode display of claim 9, wherein the first electrode is a light reflective electrode; and the second electrode is a light transflective electrode.

15. The organic light emitting diode display of claim 14, wherein each of the second electrode and the light transflective layer has a thickness of about 5 nm to about 15 nm.

16. The organic light emitting diode display of claim 14, wherein the refractive layer has a thickness of less than that of the second electrode.

17. The organic light emitting diode display of claim 16, wherein the refractive layer has a thickness of less than that of the light transflective metal layer.

18. The organic light emitting diode display of claim 16, wherein the thickness of the refractive layer is about 5 nm to about 15 nm.

19. The organic light emitting diode display of claim 7, wherein the second electrode and the light transflective layer are formed of the same material.

20. The organic light emitting diode display of claim 7, wherein the second electrode and the light transflective layer respectively comprise silver (Ag).

21. The organic light emitting diode display of claim 7, wherein the refractive layer comprises an organic material.

22. The organic light emitting diode display of claim 21, wherein a refractive index of the refractive layer is about 1.1 to about 1.8.

23. The organic light emitting diode display of claim 21, wherein the refractive index of the refractive layer is about 1.8 to about 2.2.

24. The organic light emitting diode display of claim 7, wherein the capping layer has a thickness of about 50 nm to about 110 nm.

25. An organic light emitting diode display comprising:
a substrate;
a first electrode positioned over the substrate;
an organic emission layer positioned over the first electrode;
a second electrode positioned over the organic emission layer;
a refractive layer positioned over the second electrode; and
a light transflective metal layer positioned over the refractive layer,
wherein the organic emission layer comprises:
a first emission layer portion configured to emit light of a first color;
a second emission layer portion separated from the first emission layer portion when viewed in a viewing direction perpendicular to a major surface of the substrate and configured to emit light of a second color; and
a third emission layer portion separated from the first emission layer portion and the second emission layer portion when viewed in the viewing direction and configured to emit light of a third color,
wherein a distance from the first electrode to the light transflective metal layer through the first emission layer portion, a distance from the first electrode to the light transflective metal layer through the second emission layer portion, and a distance from the first electrode to the light transflective metal layer through the third emission layer portion are substantially the same.

26. The organic light emitting diode display of claim 25, wherein light emitted from the organic emission layer undergoes resonance and reflection the constructive interference between the first electrode and the light transflective layer and a distance from the first electrode to the light transflective metal layer is satisfied by an equation as follows:

$$L < \lambda/N$$

where L is a resonant distance from the first electrode to the light transflective metal layer, $\lambda$ is a wavelength of light emitted from the organic emission layer, and N is an even number.

27. The organic light emitting diode display of claim 26, wherein N is one of 2, 4, 8, and 16.

* * * * *